United States Patent

Sugimura

[11] Patent Number: 5,930,129
[45] Date of Patent: Jul. 27, 1999

[54] POWER ON RESET CIRCUIT

[75] Inventor: Naoaki Sugimura, Tokyo, Japan

[73] Assignee: Oki Electric Industry Co., Ltd., Tokyo, Japan

[21] Appl. No.: 09/058,291

[22] Filed: Apr. 10, 1998

[30] Foreign Application Priority Data

Aug. 8, 1997 [JP] Japan .................................. 9-214497

[51] Int. Cl.$^6$ ................................................. H02M 7/517
[52] U.S. Cl. ............................................. 363/49; 323/265
[58] Field of Search ............................ 363/49; 323/265, 323/349

[56] References Cited

U.S. PATENT DOCUMENTS

| | | | |
|---|---|---|---|
| 3,823,359 | 7/1974 | Koeller et al. ............................ | 363/53 |
| 4,524,412 | 6/1985 | Eng ........................................... | 363/56 |
| 4,623,824 | 11/1986 | Klingbiel et al. ........................ | 323/256 |
| 4,626,976 | 12/1986 | Abe et al. ................................. | 363/19 |
| 5,521,808 | 5/1996 | Marvsik et al. .......................... | 363/49 |

FOREIGN PATENT DOCUMENTS

| | | |
|---|---|---|
| 63-246919 | 10/1988 | Japan . |
| 4-72912 | 3/1992 | Japan . |
| 6-196989 | 7/1994 | Japan . |

*Primary Examiner*—Adolf Deneke Berhane
*Attorney, Agent, or Firm*—Jones Volentine, L.L.P.

[57] ABSTRACT

A power on reset circuit composed of a power supply voltage sensing circuit, a capacitor charging circuit and an output circuit, the internal structure of such components as a power supply voltage sensing circuit, a capacitor charging circuit and an output circuit having a various variety but the basic concept of the power on reset circuit being on an idea to delay the time to charge a capacitor until the voltage of the power supply has increased to a certain level.

15 Claims, 12 Drawing Sheets

$Vcc = Vt101 + Vt102 + Vt103$ $Vcc = Vt_{121} + Vt_{122} + Vt_{123}$

POWER ON RESET CIRCUIT

BACKGROUND OF THE INVENTION

1. Field of the Invention

This invention relates to an improvement applicable to a power on reset circuit employable for an integrated circuit. More specifically, this invention relates to an improvement developed for simplifying the circuit structure of a power on reset circuit which issues a one shot pulse without fail, even if the increase rate of the power supply voltage is less and for decreasing the power consumption required thereby.

2. Prior Art Statement

A power on reset circuit is defined as a circuit which issues a one shot pulse, for the purpose to cause every electronic component composing a circuit to return to the initial positions, in response to a signal indicating that a power supply is turned on for the circuit.

The power on reset circuit available in the prior art consists of a charging capacitor and a circuit for charging the capacitor, which circuit for charging the capacitor is composed of a resistor or a constant current power supply, and has a function to issue a one shot pulse, in response to a signal indicating that the power supply is turned on. In such a power on reset circuit as is described above, there are some chances in which the period required for a power supply voltage to reach the rated voltage is longer than the period required for a capacitor to be charged until the rated voltage. In such a case, a one shot pulse or a power on reset signal is not issued.

This problem can be solved by technology disclosed in JP-A 63-246919, JP-A 4-72912 and/or JP-A 6-196989.

The power on reset circuit disclosed in JP-A 63-246919 or the power on reset circuit illustrated in FIG. 1 attached to this application, is provided with a flip-flop circuit which is set simultaneously with application of an electronic power supply, and a circuit for sending a power supply voltage which sets the flip-flop circuit a predetermined period later than the time at which the power supply voltage has arrived at a predetermined value of voltage.

More specifically, the power on reset circuit shown in JP-A 63-246919 illustrated in FIG. 1 attached to this specification has a flip-flop circuit (2) consisting of two inverters (2a) and (2b) to sense and hold an increase of the power supply voltage, a capacitor (3) connected the flip-flop circuit (2), a MOS transistor (4) and a power supply voltage sensing circuit (10). The power supply voltage sensing circuit (10) has a MOS diode array (14) consisting of a 2-stage inverter (11) and (12) connected the output terminal of the flip-flop circuit (2) and plural MOS diodes (13), a capacitor (15) and a MOS transistor (16).

Since the power on reset circuit shown in JP-A 63-246919 is a quite ordinary power on reset circuit having a capacitor, resistors and inverters, further comprising a supporting circuit to be connected to the quite ordinary power on reset circuit in parallel for the purpose to cause the supporting circuit to compulsively issue a signal for resetting the flip-flop circuit (2), the structure of the power on reset circuit shown in JP-A 63-246919 (10) is fairly complicated.

The power on reset circuit disclosed in JP-A 4-72912 or the power on reset circuit illustrated in FIG. 2 attached to this application, is provided with a power supply voltage sensing circuit (20) which senses whether or not the power supply voltage has reached up to a predetermined voltage, a delay circuit (30) which delays the output signal of the power supply voltage sensing circuit (20), and a wave form reverting circuit (40).

More specifically, the power supply voltage sensing circuit (20) has a series circuit of a resistor (21) and a parallel circuit of an n channel MOS diode (22) and a series circuit of a resistor (23) and a resistor (24), the series circuit being inserted between the power supply Vcc and the ground potential. The connection node at which the resistor (21) and the parallel circuit is connected, is called $N_1$. At the connection node $N_2$, the resistors (23) and (24) are inverter (25) designated to operate with the power supply voltage and the source of an n channel MOS FET (26). The inverter (25) is composed of a p channel MOS FET (25a) and an n channel MOS FET (25b). The gate of the n channel MOS FET (26) is connected to the output terminal of the inverter (25), and the drain of the n channel MOS FET (26) is connected the ground level.

The delay circuit (30) is composed of an n channel MOS FET (31) of which the source is connected to the inverter (25) and of which the gate is connected the power supply potential Vcc and a capacitor (32) connected between the drain of the n channel MOS FET (31) and the ground potential. The wave form reverting circuit (40) is composed of an inverter (41) of which the input terminal is connected to a connection node ($N_3$) connecting the n channel MOS FET (31) and the capacitor (32), and a p channel MOS FET (42) which is connected between the power supply potential (Vcc) and the node ($N_3$) and of which the gate is connected to the output terminal of the inverter (41).

Thus, since the power on reset circuit disclosed in JP-A 4-72912 is based on the idea that the voltage applied between the Vcc terminal and the ground terminal is divided by resistors (21), (23) and (24), the electric current continues flowing through the resistors (21), (23) and (24) even after the one shot pulse is issued. This means the power on reset circuit disclosed in JP-A 4-72912 is accompanied by a drawback in which electric power consumption is not necessarily marginal.

The power on reset circuit disclosed in JP-A 6-196989 or the power on reset circuit illustrated in FIG. 3 attached to this application, is provided with a series circuit composed of a p channel normally off FET (51) and a voltage control means (52), connected between the Vdd and the ground potential. The voltage control means (52) is composed of an n channel normally on FET (52a) of which the source is connected to the drain of the p channel normally off FET (51) and an n channel normally of FET (52b) of which the gate and the drain are connected to the gate and the source of the n channel normally on FET (52a). The source of the n channel normally off FET (52b) is grounded.

The drain of an n channel normally off FET (54) and a pulse generator means (53) are connected to the output terminal of the voltage control circuit (52). The source of the n channel normally off FET (54) is grounded. The pulse generator means (53) is composed of a p channel normally off FET (53a) of which the source is connected to Vdd, a capacitor (53b) which is connected between the drain of the p channel normally off FET (53a) and the ground potential and an inverter (53c) connected the connection point of the drain of the p channel normally off FET (53a) and the capacitor (53b).

The output terminal of the inverter (53c) is the output terminal of the power on reset circuit disclosed in JP-A 6-196989, and is connected an inverter (55) of which the output terminal is connected the gates of the p channel normally off FET (51) and of the n channel normally off FET (54).

In the power on reset circuit disclosed in JP-A 6-196989, the inverter (55) is essential for the purpose to make the power consumption zero, after the pulse generator means (53) issued a one shot pulse.

The foregoing prior art statement has clarified that any of the power on reset circuits which issue a one shot pulse without fail, even if the increase rate of the power supply voltage is less, available in the prior art, can not fully satisfy the requirements imposed thereon, particularly in the viewpoints of the circuit structure, power consumption or the like.

OBJECTS AND SUMMARY OF THE INVENTION

Accordingly, the object of this invention is to provide a plurality of power on reset circuits which can issue a one shot pulse without fail, even if the increase rate of the power supply voltage is less, wherein the circuit structure is simple and the power consumption is marginal for a period after the one shot pulse is once issued just after a power supply is turned on for the circuit.

To achieve the foregoing object, a power on reset circuit in accordance with this invention is generally composed of a power supply voltage sensing circuit, a capacitor charging circuit and an output circuit, the internal structure of such components as a power supply voltage sensing circuit, a capacitor charging circuit and an output circuit having a various variety but the basic concept of the power on reset circuit being on an idea to delay the time to charge a capacitor until the voltage of the power supply has increased to a certain level.

More specifically, a power on reset circuit in accordance with one example of this invention is composed of:

a power supply voltage sensing circuit further comprising:
  a voltage sensing means connected between a power supply and the ground, and turning on in response to an excess of the voltage of the power supply with respect to a first threshold value, to work as an electric current flowing path, and depicting the sensed voltage at a first node, and
  an electric current breaking means working as an ON/OFF element depending on a feed back voltage, breaking an electric current path in response to an OFF position thereof,
  whereby the power supply voltage sensing circuit senses an ON position of the power supply depending on the ON position of the electric current breaking means, a capacitor charging circuit further comprising:
  an electric current flowing path means connected between the power supply and a second node and turning on in response to the sensed voltage,
  a capacitor connected between the second node and the ground and being charged by the electric current flowing path means with a charging rate determined by a time constant, and
  a discharging means turning on in response to a deficiency of the voltage of the power supply with respect to a second threshold value, for discharging the capacitor, and an output circuit means driven with the power supply, comparing the voltage of the second node and a third threshold value and outputting a logic level corresponding to a result of the comparison, wherein the feed back voltage is the voltage of the second node.

In the power on reset circuit in accordance with the foregoing first example, the electric current breaking means can be a first FET comprising a first electric current flowing electrode connected the power supply, a second electric current flowing electrode connected the first node, and a first control electrode being inputted the feed back voltage for regulating the ON/OFF position between the first electric current flowing electrode and the second electric current flowing electrode, the voltage sensing means can be a plurality of rectifier means connected between the first node and the ground and turning on in response to an excess of the voltage of the first node with respect to a fourth threshold value, the electric current flowing path means is a second FET comprising a third electric current flowing electrode connected the power supply, a fourth electric current flowing electrode connected the second node,
and a second control electrode connected the first node and conducting an ON/OFF control of the electric current path connecting the third electric current flowing electrode and the fourth electric current flowing electrode in response to the sensed voltage, the discharging means further comprising a fifth electric current flowing electrode connected the second node, a sixth electric current flowing electrode connected the ground, and a third control electrode connected the power supply and conducting an ON/OFF control of the electric current path connecting the fifth electric current flowing electrode and the sixth electric current flowing electrode, and a third FET turning on in response to a deficiency of the voltage of the power supply with respect to a fifth threshold value.

The power on reset circuit in accordance with the foregoing second example can be further added a rectifier means or a resistor connected in series with the second FET and for increasing the ON resistance of the second FET in response to an ON position thereof, the rectifier means or a resistor being connected between the power supply and the second node.

A power on reset circuit in accordance with the other example is composed of:

a voltage sensing circuit connected in series between a power supply and an output node and turning on in response to an excess of the potential difference between the voltage of the power supply and the ground potential with respect to a sixth threshold value, a capacitor charging circuit further comprising:
  a capacitor connected between the output node and the ground and being charged by an electric current flowing in the voltage sensing circuit with a time constant to set the voltage of the output node, and a discharging means for discharging the capacitor in response to a deficiency of the voltage of the power supply with respect to a seventh threshold value, an output circuit driven with the power supply and for comparing the voltage of the second node and a eighth threshold value and for outputting a logic level corresponding to a result of the comparison.

In the power on reset circuit in accordance with the foregoing second example, the voltage sensing circuit is a plurality of rectifier means connected in series between the power supply and a first output node, and turning on in response to an excess of the voltage difference between the first output node and the power supply with respect to a ninth threshold value, and the discharging means further comprising a first electric current flowing electrode connected the output node, a second electric current flowing electrode connected the ground, a control electrode connected the power supply and conducting an ON/OFF control of the electric current path connecting the first electric current flowing electrode and the second electric current flowing electrode, and an FET turning on in response to a deficiency of the voltage of the power supply with respect to a tenth threshold value.

BRIEF DESCRIPTION OF THE DRAWINGS

This invention, together with its various features and advantages, can be readily understood from the following more detailed description presented in conjunction with the following drawings, in which.

DETAILED DESCRIPTION OF THE PREFERRED EMBODIMENTS

Referring to drawings, a detailed description will be presented below for power on reset circuits in accordance with eight independent embodiments of this invention.
First Embodiment A power on reset circuit consisting of a power supply voltage sensing circuit, a capacitor charging circuit and an output circuit or an inverter, the power on reset circuit having a function to begin outputting a one shot pulse following a turn on of the power supply of the output circuit or the inverter and to cease outputting the one shot pulse following the operation of the capacitor charging circuit which follows the operation of the power supply voltage sensing circuit, whereby the circuit structure is simple and no power consumption is required after the one shot pulse is issued just after the turn on of the power supply of the power on reset circuit, even if the power supply voltage increases with a slow rate.

Figure 1:
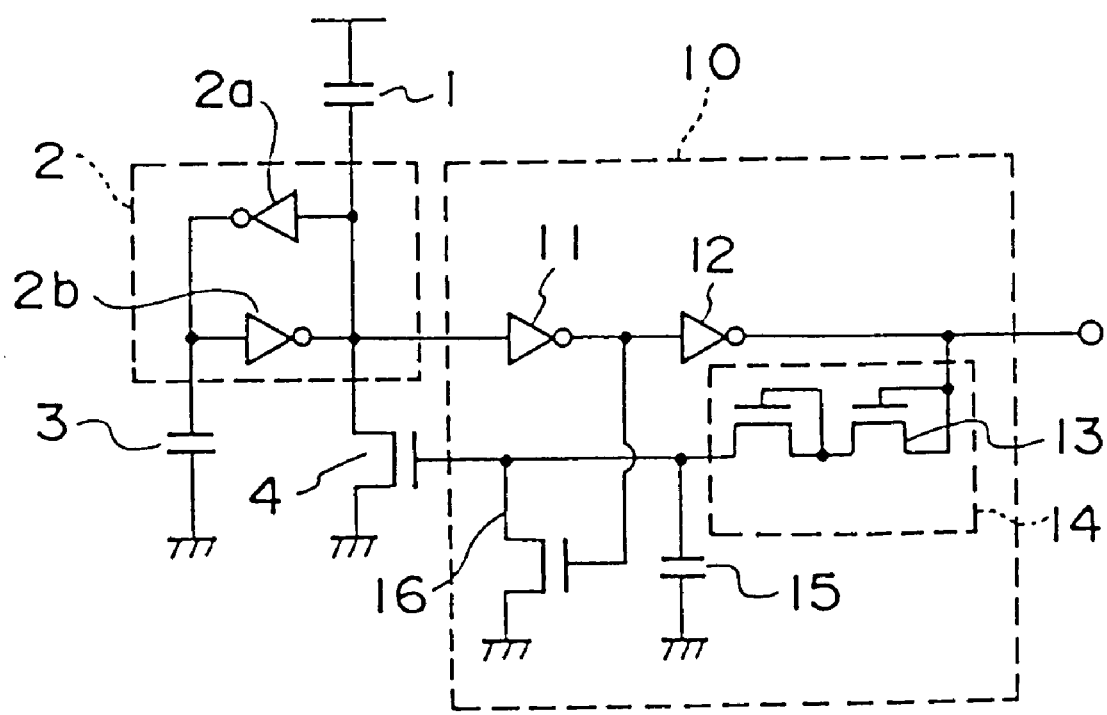
FIG. 1 is a circuit diagram of a power on reset circuit disclosed in JP-A 63-246919.
Figure 2:
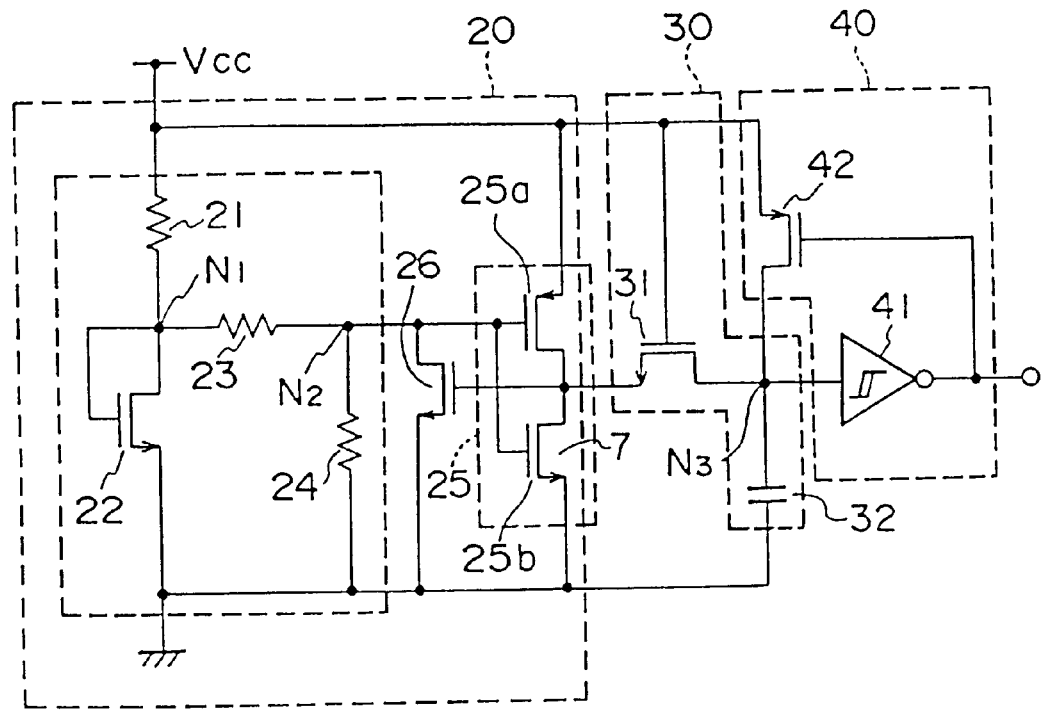
FIG. 2 is a circuit diagram of a power on reset circuit disclosed in JP-A 4-72912.
Figure 3:
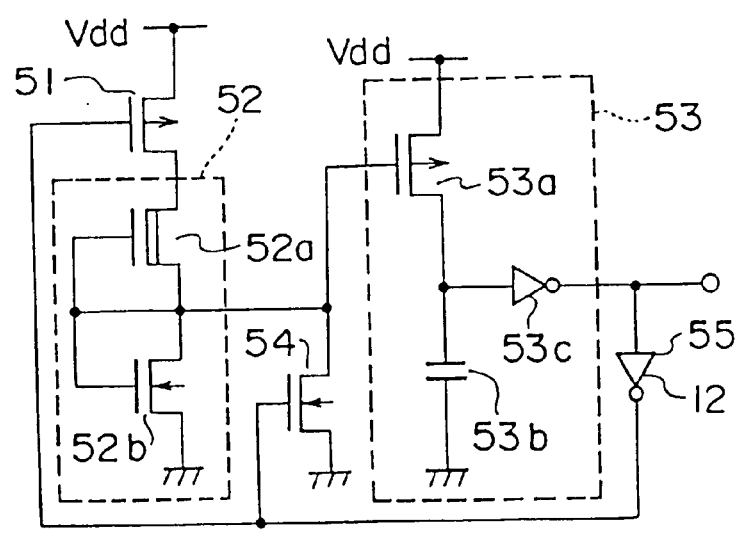
FIG. 3 is a circuit diagram of a power on reset circuit disclosed in JP-A 6-196989.
Figure 4:
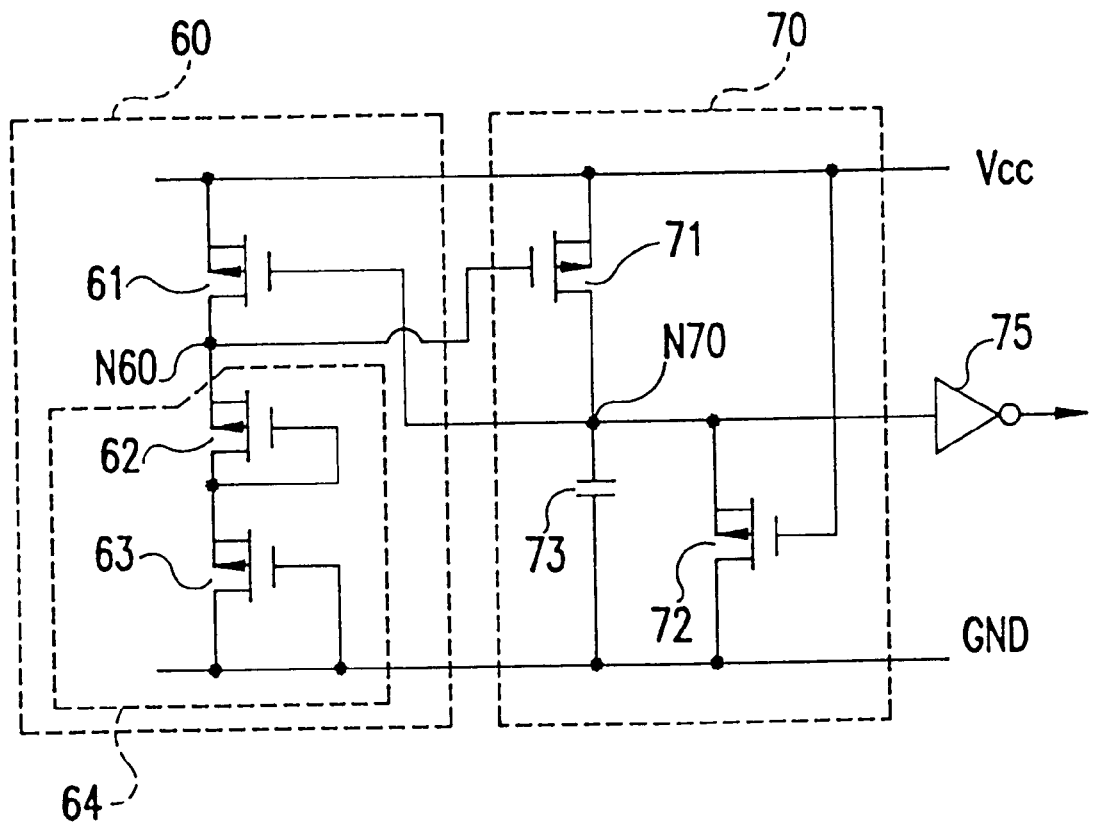
FIG. 4 is a circuit diagram of a power on reset circuit in accordance with the first embodiment of this invention.

Referring to FIG. 4, the power on reset circuit in accordance with the first embodiment of this invention consists of a power supply voltage sensing circuit (60), a capacitor charging circuit (70) and an output circuit (75).

The power supply voltage sensing circuit (60) consists of a p channel normally off FET (61) of which the source is connected to a first power supply voltage Vcc and which acts as a current breaking means, a voltage sensing means consisting of a series circuit of p channel normally off FETs (62) and (63) each of which acts as a rectifier means of a rectifier circuit 64 and which are connected between the drain of the p channel normally off FET (61) and a second power supply voltage or the ground potential. More specifically, the source of the p channel normally off FET (62) is connected to the drain of the p channel normally off FET (61), the drain of the p channel normally off FET (62) is connected to the source of the drain of the p channel normally off FET (63) and the gate of the p channel normally off FET (62). The gate and the drain of the source of the p channel normally off FET (63) are connected to the ground potential. The first connection node ($N_{60}$) which is the connection point of the drain of the p channel normally off FET (61) and the source of the p channel normally off FET (62), is the output terminal of the power supply voltage sensing circuit (60).

The capacitor charging circuit (70) consists of a p channel normally off FET (71) which acts as a current flowing means and of which the gate is connected to the node ($N_{60}$) and of which the source is connected to the Vcc, a p channel normally off FET (72) which acts as a discharge means and of which the gate is connected to the Vcc and of which the source is connected to the drain of the p channel normally off FET (71) and of which the drain is grounded, and a capacitor (73) of which one terminal is connected to the drain of the p channel normally off FET (71) and of which the other terminal is grounded. The connection point of the drain of the p channel normally off FET (71), the source of the p channel normally off FET (72) and the foregoing one terminal of the capacitor (73) is named the second connection node ($N_{70}$) which connects the gate of the p channel normally off FET (61) and the input terminal of an inverter (75), which is driven, in this example, by the voltage Vcc. The inverter (75) emits a one shot pulse.

Referring to FIGS. 4 and 5A, 5B, 5C and 5D, the operation of the power on reset circuit in accordance with the first embodiment of this invention will be described below.

Supposing the capacitor (73) still has a charge therein and the voltage Vcc is turned off, the p channel normally off FET (72) is turned on to discharge the charge stored in the capacitor (73), and the p channel normally off FET (72) turns off, when the voltage of the capacitor (73) has decreased down to the threshold voltage ($Vt_{72}$) of the p channel normally off FET (72). The potential of the node ($N_{70}$) is kept at the voltage of the capacitor (73) or the threshold voltage ($Vt_{72}$) of the p channel normally off FET (72), the inverter (75) keeps being supplied with a LOW input signal during the period in which the potential of the node ($N_{70}$) is kept at the voltage of the capacitor (73) or the threshold voltage ($Vt_{72}$) of the p channel normally off FET (72).

Accordingly, if the inverter (75) should be given its own power supply, it would output a HIGH output signal. Since the inverter (75) is not supplied with its own power supply during the period in which the Vcc is OFF, the inverter keeps outputting a LOW output signal until the Vcc is turned on.

Since the gate of the p channel normally off FET (61) is connected to the one terminal of the capacitor (73), the potential of the gate of the p channel normally off FET (61) is sufficient to keep the p channel normally off FET (61) in an OFF position.

Figure 5A:
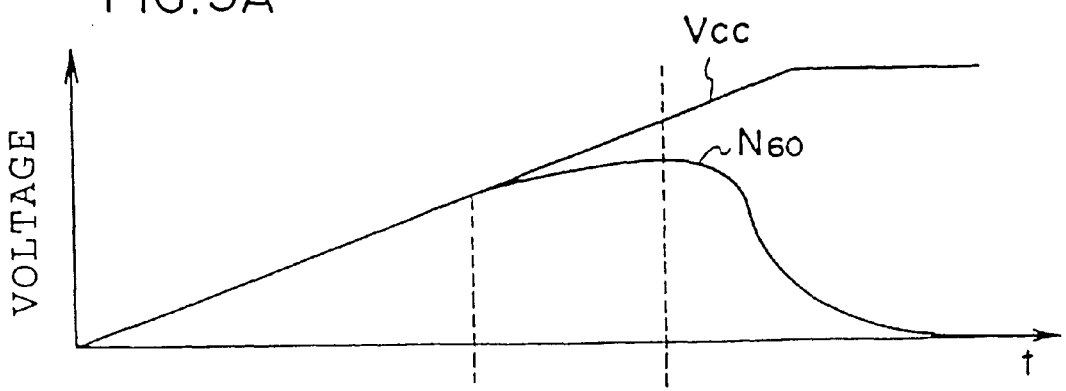
FIGS. 5A, 5B, 5C and 5D are timing charts of the power on reset circuit in accordance with the first embodiment of this invention.

Referring to FIG. 5A, when the voltage Vcc is turned on, the potential of the Vcc gradually increases.

Figure 5B:
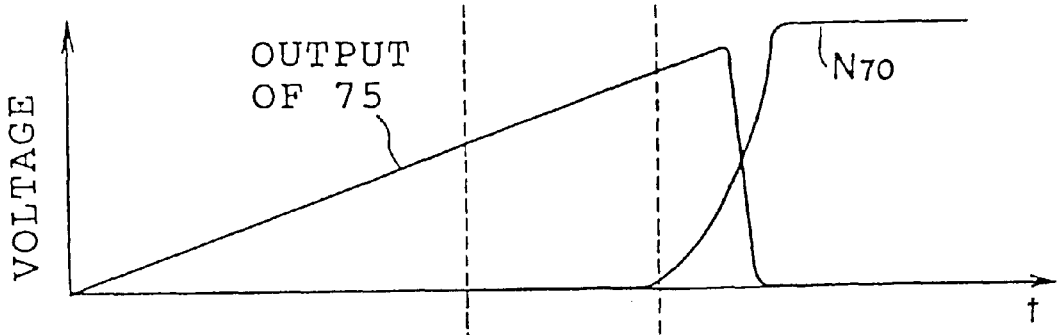

Referring to FIG. 5B, the inverter (75) begins outputting a HIGH signal which gradually increases following the increase of its own power supply or the voltage Vcc. In this manner, the power on reset circuit in accordance with the first embodiment of this invention begins outputting a one shot pulse, in response to Vcc turning on.

Referring again to FIG. 5A, when the voltage Vcc has increased up to the value equivalent to the sum of the threshold voltage of the p channel normally off FET (72) and the threshold voltage of the p channel normally off FET (61) or ($Vt_{72}+Vt_{61}$), the p channel normally off FET (61) turns on. Supposing the threshold voltages ($Vt_{62}$) and ($Vt_{63}$) respectively of the p channel normally off FET (62) and the p channel normally off FET (63) are selected to make the sum of the threshold voltage ($Vt_{62}$) and ($Vt_{63}$) or ($Vt_{62}+Vt_{63}$) larger than the sum of the threshold voltage of the p channel normally off FET (72) and the threshold voltage of the p channel normally off FET (61) or ($Vt_{72}+Vt_{61}$), the potential of the drain of the p channel normally off FET (61) is clamped at the level corresponding to the sum of the threshold voltages ($Vt_{62}$) and ($Vt_{63}$) or ($Vt_{62}+Vt_{63}$). Namely, neither p channel normally off FET (62) nor p channel normally off FET (63) turns on, resultantly causing the potential of the node ($N_{60}$) to increase, following the value of the voltage Vcc. This situation is maintained for a period from the time when the Vcc increased up to ($Vt_{72}+Vt_{61}$) through the time when the Vcc increases up to ($Vt_{62}+Vt_{63}$). During this period in which the potential of the node ($N_{60}$) is clamped, the potential of the gate of the p channel normally off FET (71) keeps increasing following the increase of the voltage Vcc, resultantly remaining the p channel normally off FET (71) in an OFF position, because the potential of the gate is kept identical to that of the source.

Figure 5C:
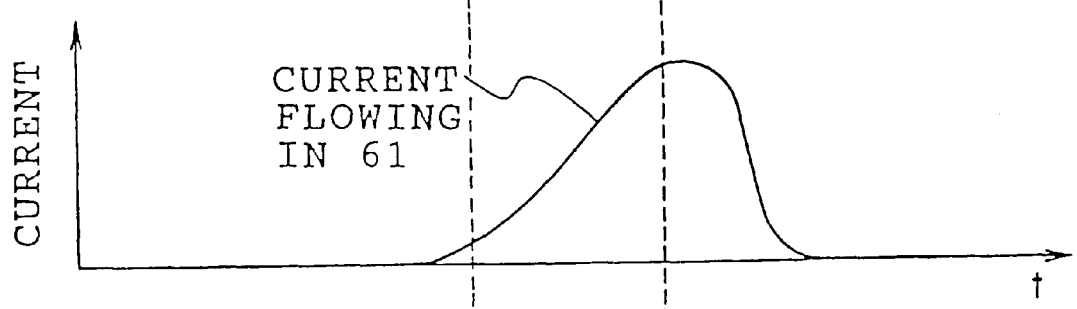

Referring to FIG. 5C, when the voltage Vcc has increased up to the level of ($Vt_{62}+Vt_{63}$), the p channel normally off FETs (62) and (63) turn on to cause an electric current to flow in the p channel normally off FET (61). As a result, the potential of the node ($N_{60}$) increases up to the potential level (Vcc–$Vt_{62}$–$Vt_{63}$), which is applied between the source and the drain of the p channel normally off FET (71).

Figure 5D:
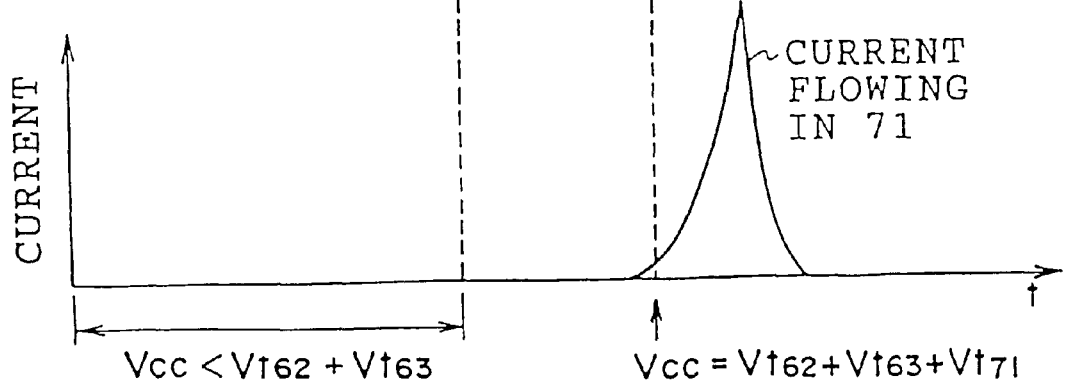

Referring to FIG. 5D, when the voltage Vcc has increased up to the potential level ($Vt_{62}+Vt_{63}+Vt_{71}$), the p channel normally off FET (71) turns on to cause an electric current to flow in the p channel normally off FET (71) and to begin charging the capacitor (73), resultantly increasing the potential of the node ($N_{70}$) with an increase rate determined by a time constant determined by the product of the ON resistance of the p channel normally off FET (71) and the capacity of the capacitor (73) or the value of ($C_{73} \cdot R_{73}$).

Referring to FIG. 5B, when the potential level of the node ($N_{70}$) or the potential of the input signal of the inverter (75) has increased up to the threshold voltage of the inverter (75), the inverter (75) inverts the output thereof from the HIGH level to the LOW level. At this point of time, the power on reset circuit in accordance with the first embodiment of this invention ceases outputting the one shot pulse.

Referring to FIG. 5B, the increase of the potential of the node ($N_{70}$) further goes on, and when the potential difference between the gate and the source of the p channel normally off FET (61) has decreased to the threshold voltage of the p channel normally off FET (61), the p channel normally off FET (61) turns off and ceases flowing the electric current.

Referring to FIGS. 5A and 5B, the turn off of the p channel normally off FET (61) results in a decrease of the potential of the node ($N_{60}$), which decrease causes the p channel normally off FET (71) to turn off. As a result, the potential of the node ($N_{70}$) is kept at a HIGH level, which causes the inverter (75) to keep outputting a LOW level signal.

After the one shot pulse is issued, no electric current flows in the power on reset circuit in accordance with the first embodiment of this invention, resultantly requiring no further power consumption.

The foregoing description has clarified that the first embodiment of this invention has successfully provided a power on reset circuit which can issue a one shot pulse, even if the power supply voltage increases with a slow rate, wherein the circuit structure is simple and no power consumption is required after a one shot pulse is issued just after the power supply Vcc is turned on.

Second Embodiment

A power on reset circuit consisting of a power supply voltage sensing circuit, a capacitor charging circuit and an output circuit or an inverter, the power on reset circuit having a function to begin outputting a one shot pulse following a turn on of the power supply of the output circuit or the inverter and to cease outputting the one shot pulse following the operation of the capacitor charging circuit which follows the operation of the power supply voltage sensing circuit, whereby the circuit structure is simple and no power consumption is required after the one shot pulse is issued just after the turn on of the power supply of the power on reset circuit, even if the power supply voltage increases with a slow rate.

Figure 6:
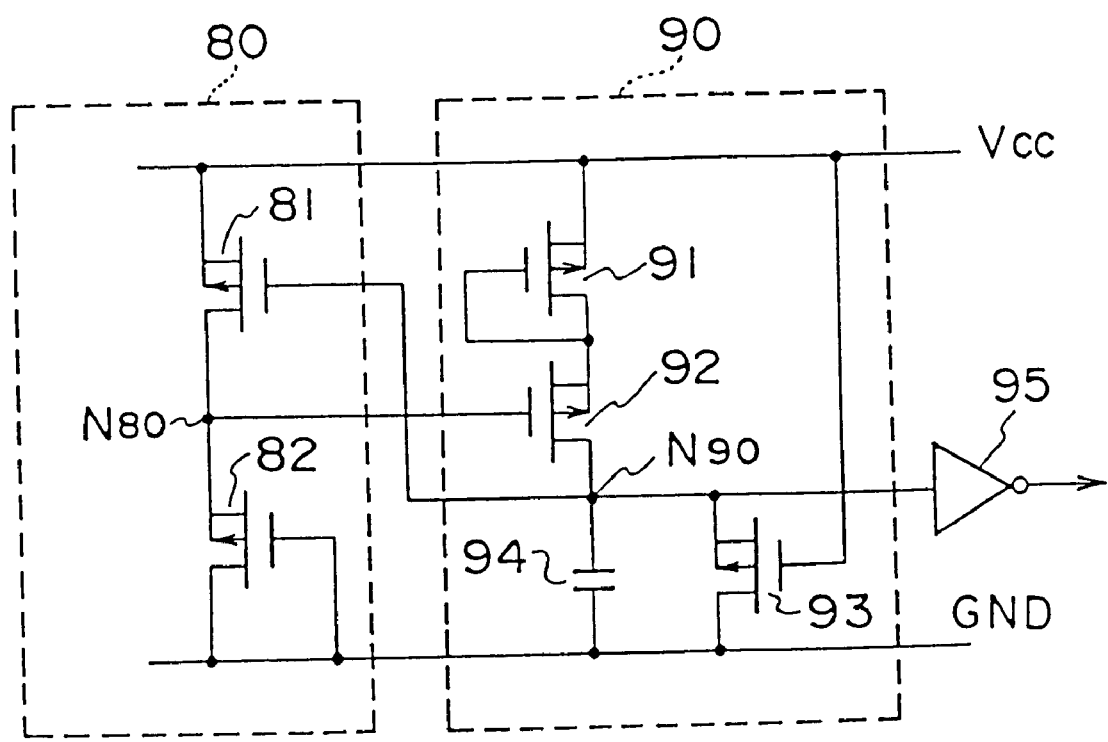
FIG. 6 is a circuit diagram of a power on reset circuit in accordance with the second embodiment of this invention.

Referring to FIG. 6, the power on reset circuit in accordance with the second embodiment of this invention consists of a power supply voltage sensing circuit (80), a capacitor charging circuit (90) and an output circuit (95).

The power supply voltage sensing circuit (80) consists of a p channel normally off FET (81) of which the source is connected to the Vcc and which acts as a current breaking means and a p channel normally off FET (81) of which the source is connected to the drain of the p channel normally off FET (81) and of which the gate and the drain are grounded. The first node ($N_{80}$) which is the connection point of the drain of the p channel normally off FET (81) and the source of the p channel normally off FET (82) is an output terminal of the power supply voltage sensing circuit (81).

The capacitor charging circuit (90) consists of a p channel normally off FET (91) of which the source is connected to the Vcc, of which the gate is connected the drain of the p channel normally off FET (91) and which acts as a rectifier means, a p channel normally off FET (92) of which the gate is connected to the node ($N_{80}$) and of which the source is connected the drain of the p channel normally off FET (91) and which acts as a current flowing means, a p channel normally off FET (93) of which the gate is connected to the Vcc, of which the drain is grounded and which acts as a discharge means and a capacitor (94) of which one terminal is connected to the drain of the p channel normally off FET (92), the source of the p channel normally off FET (93) and the gate of the p channel normally off FET (81) and of which the other terminal is grounded. The connection point of the one terminal of the capacitor (94), the source of the p channel normally off FET (93) and the gate of the p channel normally off FET (81) is named a node ($N_{90}$), which is an output terminal of the capacitor charging circuit (90). The output circuit (95) is an inverter inputted an input signal from the node ($N_{90}$) and is operated with the Vcc.

Referring to FIGS. 7A, 7B, 7C and 7D, the operation of the power on reset circuit in accordance with the second embodiment of this invention will be described below.

Supposing the capacitor (94) still has a charge therein and the voltage Vcc is turned of, the p channel normally off FET (93) is turned on to discharge the charge stored in the capacitor (94), and the p channel normally off FET (93) turns off, when the voltage of the capacitor (94) has decreased down to the threshold voltage ($Vt_{93}$) of the p channel normally off FET (93). The potential of the node ($N_{90}$) is kept at the voltage of the capacitor (94) or the threshold voltage ($Vt_{93}$) of the p channel normally off FET (93), the inverter (95) keeps being applied a LOW input signal during the period in which the potential of the node ($N_{90}$) is kept at the voltage of the capacitor (94) or the threshold voltage ($Vt_{93}$) of the p channel normally off FET (93). Accordingly, if the inverter (95) should be given its own power supply, it would output a HIGH output signal. Since the inverter (95) is not supplied with its own power supply during the period in which the voltage Vcc is OFF, the inverter keeps outputting a LOW output signal until the voltage Vcc is turned on.

Since the gate of the p channel normally off FET (81) is connected the one terminal of the capacitor (94), the potential of the gate of the p channel normally off FET (81) is sufficient to keep the p channel normally off FET (81) in an OFF position.

Figure 7A:
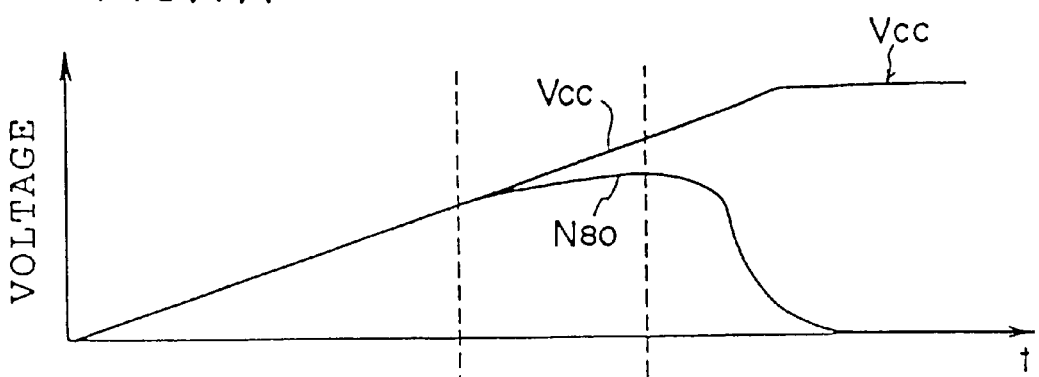
FIGS. 7A, 7B, 7C and 7D are timing charts of the power on reset circuit in accordance with the second embodiment of this invention.

Referring to FIG. 7A, when the voltage Vcc is turned on, the potential of the voltage Vcc gradually increases.

Figure 7B:
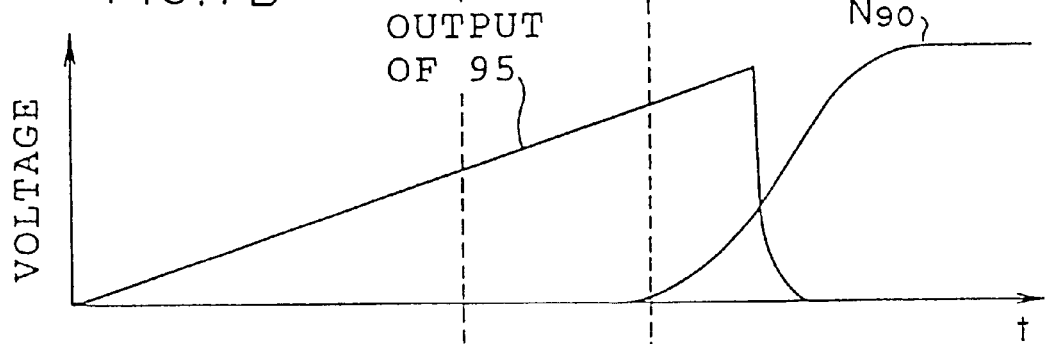
Figure 7C:
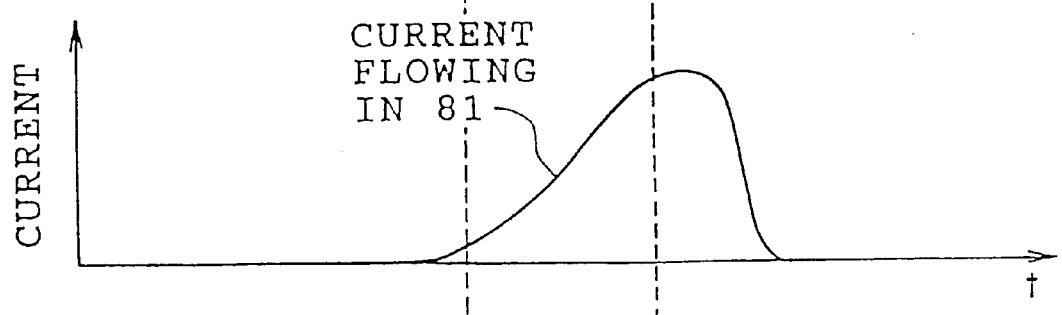

Referring to FIG. 7B, the inverter (95) begins outputting a HIGH signal which gradually increases following the increase of its own power supply or the voltage Vcc. In this manner, the power on reset circuit in accordance with the second embodiment of this invention begins outputting a one shot pulse, in response to the turn on of the voltage Vcc.

Referring again to FIGS. 7A and 7C, when the voltage Vcc has increased up to the value equivalent to the sum of the threshold voltage of the p channel normally off FET (93) and the threshold voltage of the p channel normally off FET (81) or ($Vt_{93}+Vt_{81}$), the p channel normally off FET (81) turns on, provided the threshold voltage of the p channel normally off FET (82) is sufficiently small.

Supposing the threshold voltage ($Vt_{82}$) of the p channel normally off FET (82) is selected to be larger than the sum of the threshold voltage of the p channel normally off FET (93) and the threshold voltage of the p channel normally off FET (81) or ($Vt_{93}+Vt_{81}$), the potential of the drain of the p channel normally off FET (81) is clamped at the threshold voltage ($Vt_{82}$) of the p channel normally off FET (82). Namely, the potential of the node ($N_{80}$) is clamped at the threshold voltage ($Vt_{82}$) of the p channel normally off FET (82) as well. Incidentally, the potential of the source of the p channel normally off FET (92) is clamped at the threshold voltage of the p channel normally off FET (91).

Figure 7D:
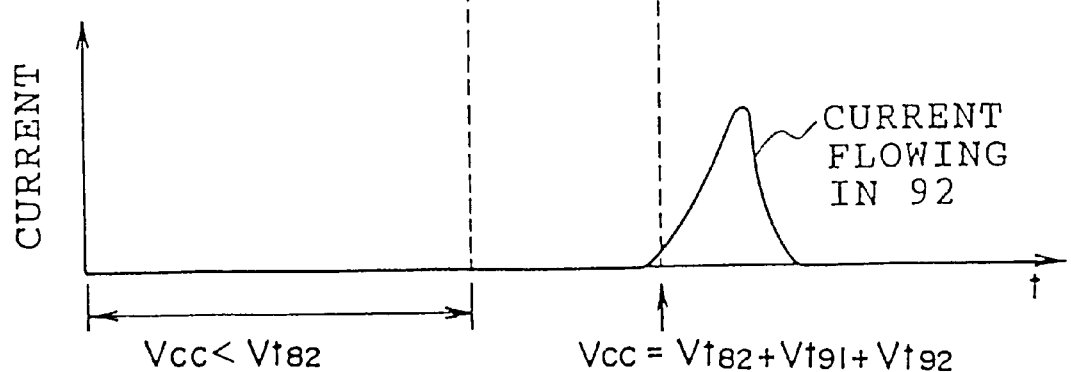

Referring to FIG. 7D, the potential difference between the source and the gate of the p channel normally off FET (92) is ($Vcc-Vt_{91}-Vt_{82}$). Therefore, when the voltage Vcc has increased up to a value satisfying the condition that value ($Vcc-Vt_{91}-Vt_{82}$) exceeds the threshold voltage of the p channel normally off FET (92), the p channel normally off FET (92) turns on. In other words, the voltage Vcc has increased up to ($Vt_{92}+Vt_{91}+Vt_{82}$), the p channel normally off FET (92) turns on to cause an electric current to begin flowing into the capacitor (94), resultantly increasing the potential of the node ($N_{90}$) with an increase rate determined by a time constant determined by the product of the ON resistance of the p channel normally off FET (92) and the capacity of the capacitor (94) or the value of ($C_{94} \cdot R_{92}$).

Referring to FIG. 7B, when the potential level of the node ($N_{90}$) or the potential of the input signal of the inverter (95) has increased up to the threshold voltage of the inverter (95), the inverter (95) inverts the output thereof from the HIGH level to the LOW level. At this point of time, the power on reset circuit in accordance with the second embodiment of this invention ceases outputting the one shot pulse.

Referring to FIG. 7B, the increase of the potential of the node ($N_{90}$) further goes on, and when the potential difference between the gate and the source of the p channel normally off FET (81) has decreased to the threshold voltage of the p channel normally off FET (81), the p channel normally off FET (81) turns off and ceases flowing the electric current into the capacitor (94).

Referring to FIGS. 7A and 7B, the turn off of the p channel normally off FET (81) results in a decrease of the potential of the node ($N_{90}$), which decrease causes the p channel normally off FET (92) to turn off. As a result, the potential of the node ($N_{90}$) is kept at a HIGH level, which causes the inverter (95) to keep outputting a LOW level signal.

After the one shot pulse is issued, no electric current flows in the power on reset circuit in accordance with the second embodiment of this invention, resultantly requiring no further power consumption.

The foregoing description has clarified that the second embodiment of this invention has successfully provided a power on reset circuit which can issue a one shot pulse, even if the power supply voltage increases with a slow rate, wherein the circuit structure is simple and no power consumption is required after a one shot pulse is issued just after the power supply Vcc is turned on.

It is further noted that the power on reset circuit in accordance with the second embodiment of this invention has an additional advantage described as follows.

The power on reset circuit can issue a one shot pulse for a period longer than that of the first embodiment without increasing the capacity of the capacitor.

Since a p channel normally off FET (91) intervenes between the voltage Vcc and the source of the p channel normally off FET (92), the p channel normally off FET (92) turns out to work in the non-saturated area, resultantly decreasing the source-drain current flowing in the p channel normally off FET (92). This causes a reduction in the charging rate of the capacitor (94). Therefore, provided the threshold voltage of the inverter (95) is selected to be higher than the voltage at which the p channel normally off FET (92) works in the non-saturated area, it keeps issuing a one shot pulse for a period longer than that of the first embodiment without increasing the capacity of the capacitor.

Third Embodiment

A power on reset circuit consisting of a power supply voltage sensing circuit, a capacitor charging circuit and an output circuit or an inverter, the power on reset circuit having a function to begin outputting a one shot pulse following a turn on of the power supply of the output circuit or the inverter and to cease outputting the one shot pulse following the operation of the capacitor charging circuit which follows the operation of the power supply voltage sensing circuit, whereby the circuit structure is simple and no power consumption is required after the one shot pulse is issued just after the turn on of the power supply of the power on reset circuit, even if the power supply voltage increases with a slow rate.

Figure 8:
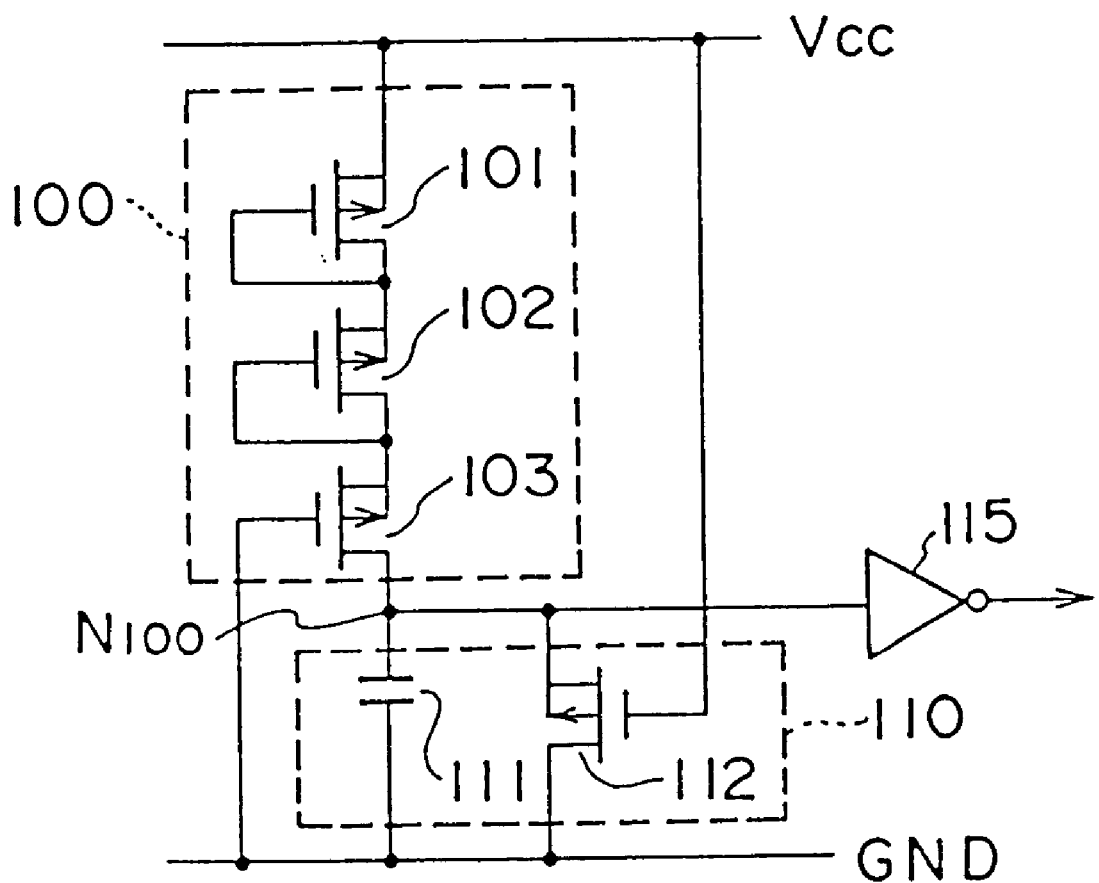
FIG. 8 is a circuit diagram of a power on reset circuit in accordance with the third embodiment of this invention.

Referring to FIG. 8, the power on reset circuit in accordance with the third embodiment of this invention consists of a power supply voltage sensing circuit (100), a capacitor charging circuit (110) and an output circuit (115).

The power supply voltage sensing circuit (100) consists of a p channel normally off FET (101) of which the source is connected to the voltage Vcc and of which the gate is connected to the drain thereof to cause it to act as a rectifier, a p channel normally off FET (102) of which the source is connected to the drain of the p channel normally off FET (101) and of which the gate is connected the drain thereof to cause it to act as a rectifier and a p channel normally off FET (103) of which the source is connected the drain of the p channel normally off FET (102), of which the gate is connected to the ground potential and of which the drain is connected to a node ($N_{100}$).

Capacitor charging circuit (110) consists of a capacitor (111) of which the one terminal is connected to the node ($N_{100}$) and of which the other terminal is grounded and a p channel normally off FET (112) of which the gate is connected to the voltage Vcc, of which the source is connected to the node ($N_{100}$) and of which the drain is grounded, which p channel normally off FET (112) acts as a discharge means.

The input terminal of the output circuit (115) or an inverter (115) is connected to the node ($N_{100}$) to output the inverted signal of the potential of the node ($N_{100}$). The inverter is driven by the voltage Vcc as well.

Figure 9A:
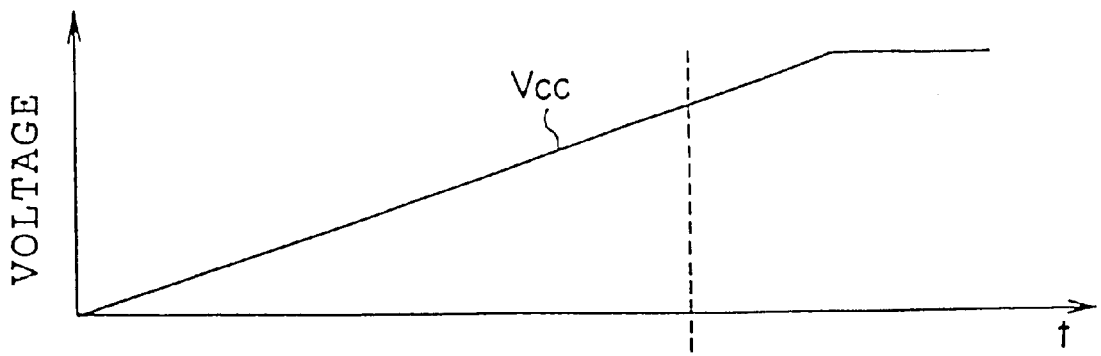
FIGS. 9A, 9B and 9C are timing charts of the power on reset circuit in accordance with the third embodiment of this invention.
Figure 9B:
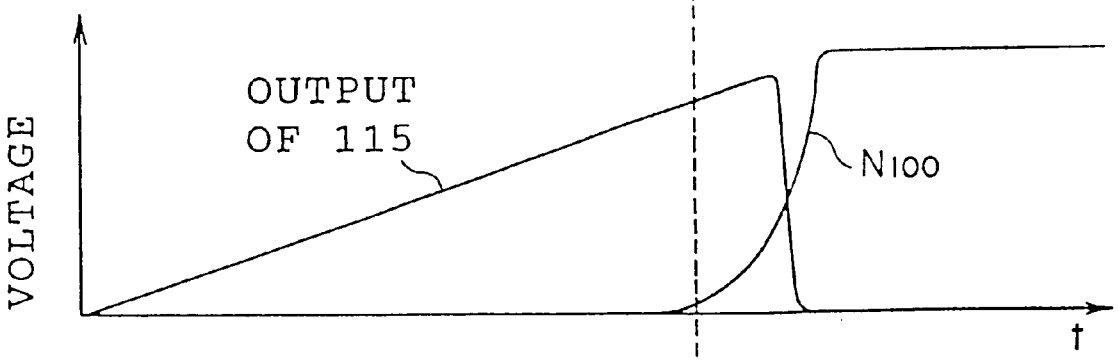
Figure 9C:
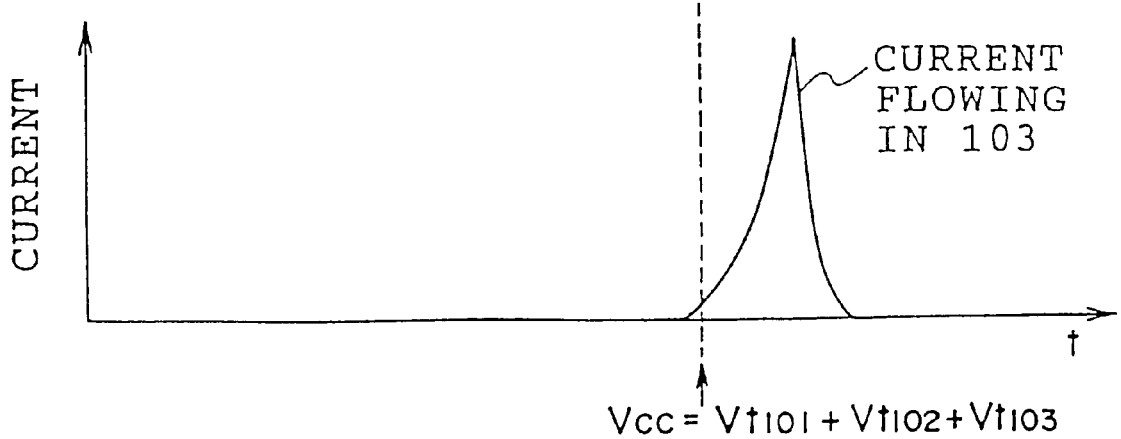

Referring to FIGS. 9A, 9B and 9C, the operation of the power on reset circuit in accordance with the third embodiment of this invention will be described below.

Supposing the capacitor (111) still has a charge therein and the voltage Vcc is turned of, the p channel normally off FET (112) is turned on to discharge the charge stored in the capacitor (111), and the p channel normally off FET (112) turns off, when the voltage of the capacitor (111) has decreased down to the threshold voltage ($Vt_{112}$) of the p channel normally off FET (112). The potential of the node ($N_{100}$) is kept at the voltage of the capacitor (111) or the threshold voltage ($Vt_{112}$) of the p channel normally off FET (112), the inverter (115) keeps being applied a LOW input signal during the period in which the potential of the node ($N_{100}$) is kept at the voltage of the capacitor (111) or the threshold voltage ($Vt_{112}$) of the p channel normally off FET (112). Accordingly, if the inverter (115) should be given its own power supply, it would output a HIGH output signal. Since the inverter (1 15) is not supplied with its own power supply during the period in which the voltage Vcc is OFF, the inverter keeps outputting a LOW output signal until the voltage Vcc is turned on.

Referring to FIG. 9A, when the voltage Vcc is turned on, the potential of the voltage Vcc gradually increases.

Referring to FIG. 9B, the inverter (115) begins outputting a HIGH signal which gradually increases following the increase of its own power supply or the Vcc. In this manner, the power on reset circuit in accordance with the third embodiment of this invention begins outputting a one shot pulse, in response to the turn on of the Vcc.

Referring to FIG. 9C, when the Vcc has increased to ($Vt_{101}+Vt_{102}+Vt_{103}$), the p channel normally off FETs (101), (102) and (103) turn on to begin charging the capacitor (111), resultantly increasing the potential level of the node ($N_{100}$) with an increase rate determined by the product of the ON resistance of the p channel normally off FET (112) and the capacity of the capacitor (111) or the value of ($C_{111} \cdot R_{112}$).

Referring to FIG. 9B, when the potential level of the node ($N_{100}$) or the potential of the input signal of the inverter (115) has increased up to the threshold voltage of the inverter (115), the inverter (115) inverts the output thereof from the HIGH level to the LOW level. At this point of time, the power on reset circuit in accordance with the third embodiment of this invention ceases outputting the one shot pulse.

Referring to FIG. 9B, the increase of the potential of the node ($N_{100}$) further goes on, and the potential of the drain of the p channel normally off FET (103) increases, resultantly causing the p channel normally off FET (103) to work in the non-saturated area. Finally, the p channel normally off FET (103) turns off to keep the potential of the node ($N_{100}$) at a HIGH level, which causes the inverter (115) to keep outputting a LOW level signal.

After the one shot pulse is issued, no electric current flows in the power on reset circuit in accordance with the third embodiment of this invention, resultantly requiring no further power consumption.

The foregoing description has clarified that the third embodiment of this invention has successfully provided a power on reset circuit which can issue a one shot pulse, even if the power supply voltage increases with a slow rate, wherein the circuit structure is simple and no power consumption is required after a one shot pulse is issued just after the power supply Vcc is turned on.

Similarly in the case of second embodiment, the period of the one shot pulse can be prolonged, to cause the power on reset circuit in accordance with the third embodiment of this invention to be appropriate for a case in which a longer one shot pulse is required.

The working area of the p channel normally off FET (103) is shifted from the saturated area to a non-saturated area, under a condition in which the capacitor (111) is highly charged, resultantly decreasing the source-drain current flowing in the p channel normally off FET (103). This causes a reduction in the charging rate of the capacitor (111). Therefore, provided the threshold voltage of the inverter (115) is selected to be higher than the voltage at which the p channel normally off FET (103) works in the non-saturated area, it keeps issuing a one shot pulse for a period longer than that of the first embodiment without increasing the capacity of the capacitor.

In addition, it is noted the quantity of FETs employed for this embodiment is less than that of either the first or the second embodiment.

Fourth Embodiment

A power on reset circuit consisting of a power supply voltage sensing circuit, a capacitor charging circuit and an output circuit or an inverter, the power on reset circuit having a function to issue a one shot pulse, even if the power supply voltage increases with a slow rate, in a similar manner as the other embodiments, wherein n channel normally off FETs are employed rather than p channel normally off FETs, whereby the one shot pulse has a form of HIGH-LOW-HIGH.

Figure 10:
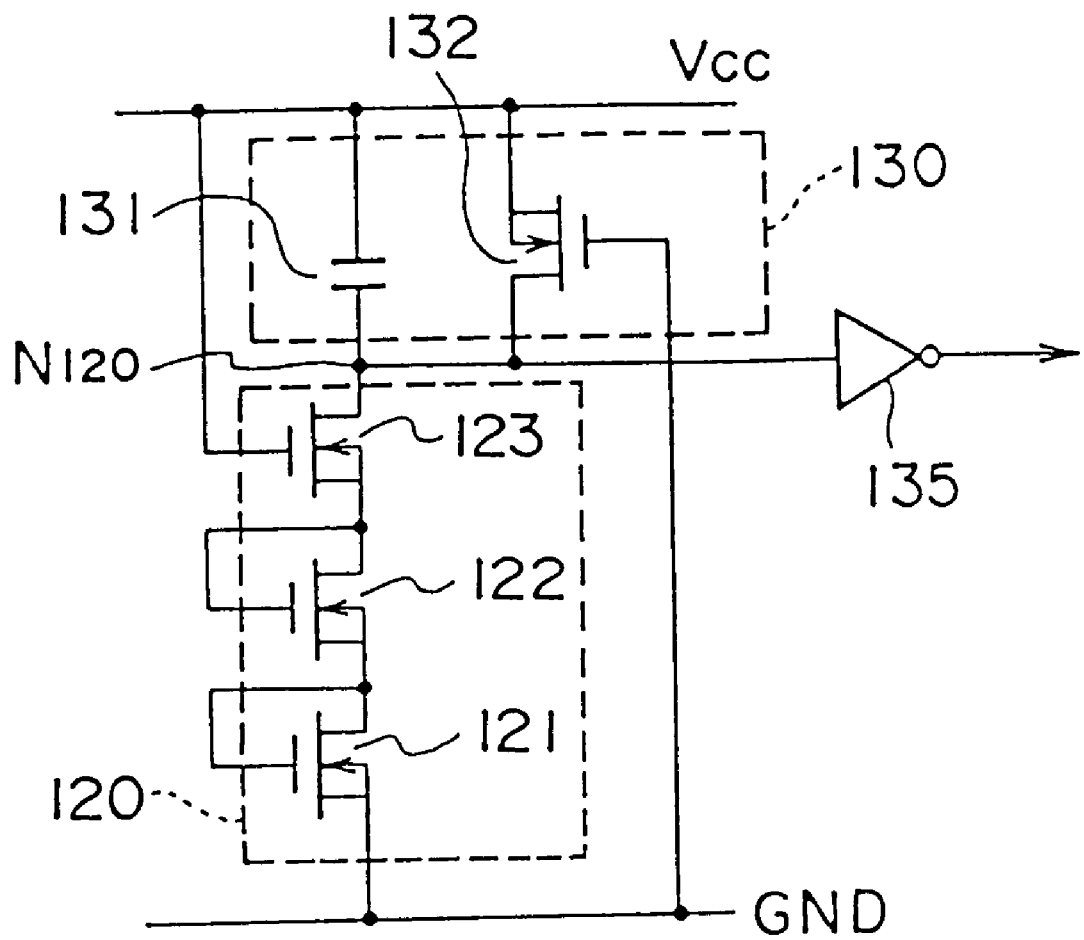
FIG. 10 is a circuit diagram of a power on reset circuit in accordance with the fourth embodiment of this invention, FIGS. 11A, 11 B and 11C are timing charts of the power on reset circuit in accordance with the fourth embodiment of this invention.

Referring to FIG. 10, the power on reset circuit in accordance with the fourth embodiment of this invention consists of a power supply voltage sensing circuit (120), capacitor charging circuit (130) and an output circuit (135).

The power supply voltage sensing circuit (120) consists of an n channel normally off FET (121) of which the source is grounded, of which the gate is connected to the drain thereof, an n channel normally off FET (122) of which the source is connected to the drain of the n channel normally off FET (121) and of which the gate is connected to the drain thereon and an n channel normally off FET (123) of which the source is connected to the drain of the n channel normally off FET (122), of which the gate is connected to the Vcc and of which the drain is connected a node ($N_{120}$).

The capacitor charging circuit (130) consists of a capacitor (131) of which the one terminal is connected to the node ($N_{120}$) and of which the other terminal is connected to the Vcc and an n channel normally off FET (132) of which the gate is grounded, of which the source is connected to the voltage Vcc and of which the drain is connected to the node ($N_{120}$).

The input terminal of the output circuit (135) of an inverter (135) is connected to the node ($N_{120}$) to output the inverted signal of the potential of the node ($N_{120}$).

This circuit structure can readily be realized by employing a semiconductor substrate having a P well.

Figure 11A:
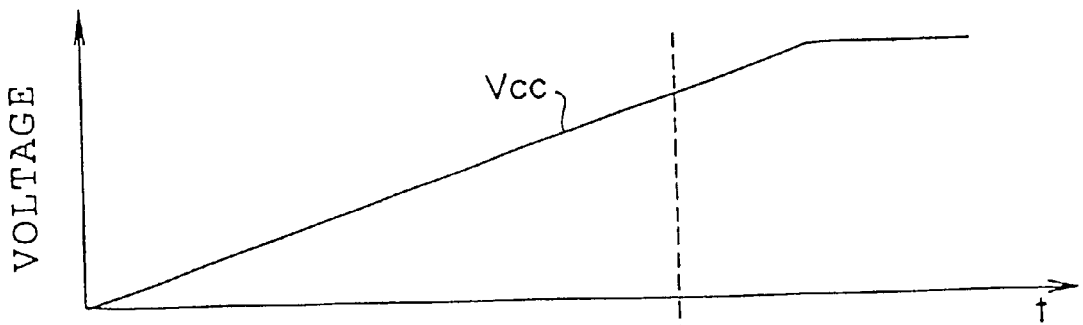
Figure 11B:
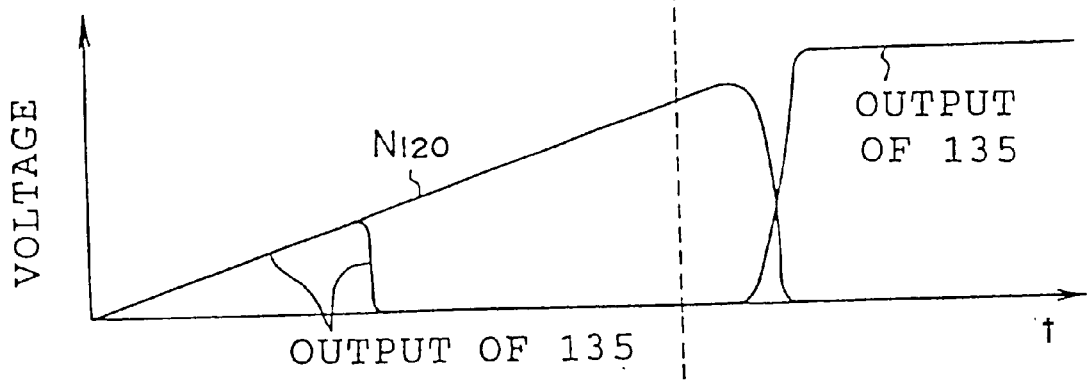
Figure 11C:
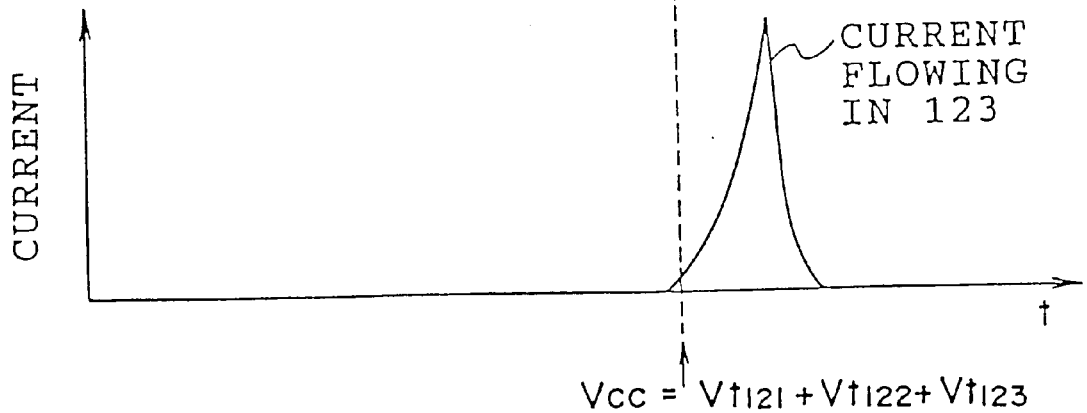

Referring to FIGS. 11A, 11B and 11C, the operation of the power on reset circuit in accordance with the fourth embodiment of this invention will be described below.

Supposing the capacitor (131) still has a charge therein and the voltage Vcc is turned off, the n channel normally off FET (132) is turned on to discharge the charge stored in the capacitor (131), and the n channel normally off FET (132) turns off, when the voltage of the capacitor (131) has decreased down to the threshold voltage ($Vt_{132}$) of the n channel normally off FET (132). The potential of the node ($N_{120}$) is kept at the voltage of the capacitor (131) or the threshold voltage ($Vt_{132}$) of the n channel normally off FET (132), the inverter (135) keeps being applied a LOW input signal during the period in which the potential of the node ($N_{120}$) is kept at the voltage of the capacitor (131) or the threshold voltage ($Vt_{132}$) of the n channel normally off FET (132). Accordingly, if the inverter (135) should be given its own power supply, it would output a HIGH output signal. Since the inverter (135) is not applied its own power supply during the period in which the Vcc is OFF, the inverter keeps outputting a LOW output signal until the Vcc is turned on.

Referring to FIG. 11A, when the Vcc is turned on, the potential of the voltage Vcc gradually increases.

Referring to FIG. 11B, since the capacitor (131) is not charged until the power supply voltage sensing circuit (120) is turned on, the potential of the node ($N_{120}$) increases following the voltage Vcc. During the period in which the potential of the node ($N_{120}$) is still less than the threshold voltage of the inverter (135), the inverter (135) outputs a HIGH level output. When the potential of the node ($N_{120}$) has increased up to the threshold voltage of the inverter (135), the inverter (135) invert its output signal and begin outputting a LOW level output. This is the front edge of the one shot pulse issued by the power on reset circuit in accordance with the fourth embodiment of this invention.

Referring to FIG. 11C, the potential (Vcc–$Vt_{132}$) of the node ($N_{120}$) increases following the increase of the voltage Vcc. When the drain potential of the n channel normally off FET (123) has increased up to the sum of the threshold voltages ($Vt_{121}$, $Vt_{122}$ or $Vt_{123}$) of the n channel normally off FET (121), (122) and (123), the n channel normally off FET (123) turns on to begin charging the capacitor (131), resultantly decreasing the potential of the node ($N_{120}$) with a decrease rate determined by a time constant determined by the product of the ON resistance of the n channel normally off FET (123) and the capacity of the capacitor (131) or the value of ($C_{131} \cdot R_{123}$).

Referring to FIG. 11B, when the potential level of the node ($N_{120}$) or the potential of the input signal of the inverter (135) has decreased down to the threshold voltage of the inverter (135), the inverter (135) inverts the output thereof from the LOW level to the HIGH level. At this point of time, the power on reset circuit in accordance with the fourth embodiment of this invention ceases outputting the one shot pulse.

The potential of the node ($N_{120}$) further decreases and this decrease in the potential of the node ($N_{120}$) or the potential of the drain of the n channel normally off FET (123) causes the operating range thereof to shift from a saturated range to a non-saturated range, and finally the n channel normally off FET (123) turns off, resultantly keeping the level of the node ($N_{120}$) at a LOW potential level.

No more electric power is required any longer.

The foregoing description has clarified that the fourth embodiment of this invention has successfully provided a power on reset circuit that can issue a one shot pulse, even if the power supply voltage increases with a slow rate, wherein the circuit is simple and no power consumed after a one shot pulse is issued.

Fifth Embodiment

A modification of the first embodiment, in which the p channel normally off FETs are replaced by n channel normally off FETs.

Figure 12:
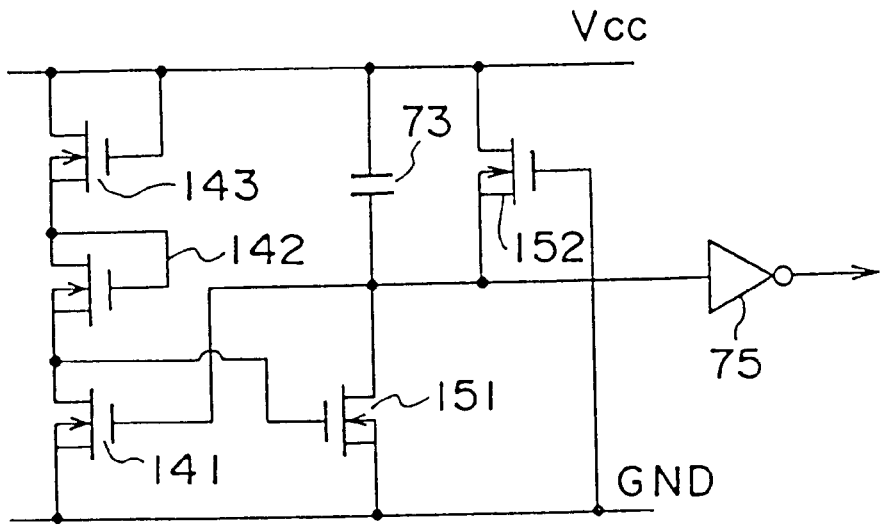
FIG. 12 is a circuit diagram of a power on reset circuit in accordance with the fifth embodiment of this invention.

Referring to FIG. 12, the p channel normally off FETs (61) through (63), (71) and (72) of the power on reset circuit in accordance with the first embodiment illustrated in FIG. 4 are replaced respectively by n channel normally off FETs (141) through (143), (151) and (152), and the voltage Vcc illustrated in FIG. 4 is replaced by the ground potential.

Sixth Embodiment

A modification of the second embodiment, in which the p channel normally off FETs are replaced by n channel normally off FETs.

Figure 13:
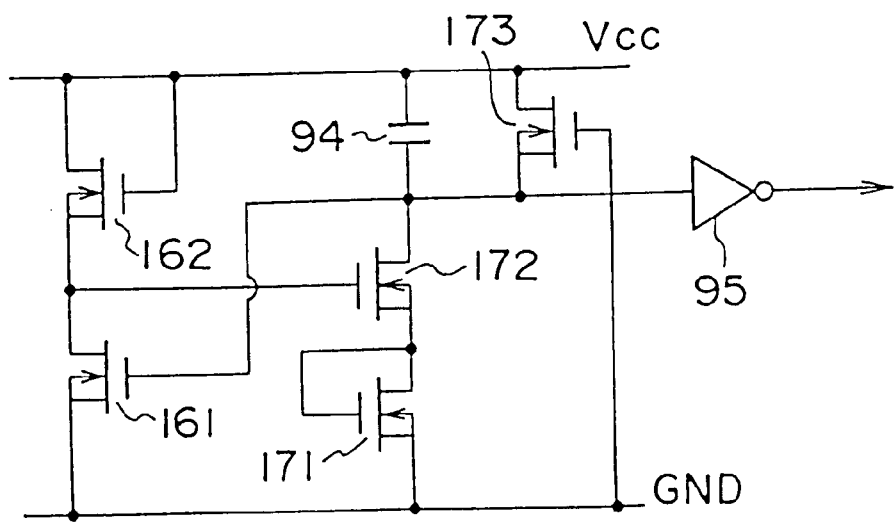
FIG. 13 is a circuit diagram of a power on reset circuit in accordance with the sixth embodiment of this invention.

Referring to FIG. 13, the p channel normally off FETs (81), (82) and (91) through (93) of the power on reset circuit in accordance with the second embodiment illustrated in FIG. 6 are replaced respectively by n channel normally off FETs (161), (162) and (171) through (173), and the voltage Vcc illustrated in FIG. 6 is replaced by the ground potential.

Seventh Embodiment

A modification of the third embodiment, in which the p channel normally off FETs are replaced by n channel normally off FETs, a combination of diodes, a resistor and a bipolar transistor.

Figure 14:
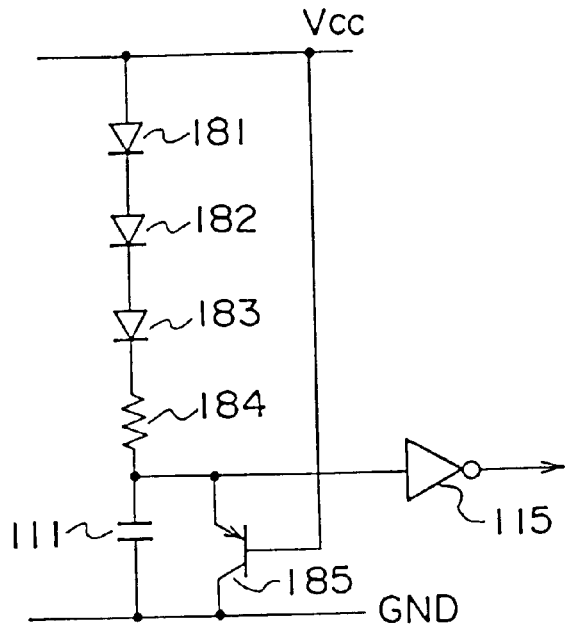
FIG. 14 is a circuit diagram of a power on reset circuit in accordance with the seventh embodiment of this invention.

Referring to FIG. 14, the p channel normally off FETs (101) and (102) illustrated in FIG. 8 are replaced by diodes (181) and (182), the p channel normally off FET (103) illustrated in FIG. 8 is replaced by a series circuit of a diode (183) and a resistor (184), and the p channel normally off FET (112) illustrated in FIG. 8 is replaced by a bipolar transistor (185).

Eighth Embodiment

A modification of the fourth embodiment, in which the n channel normally off FETs are replaced by a combination of diodes, a resistor and a bipolar transistor.

Figure 15:
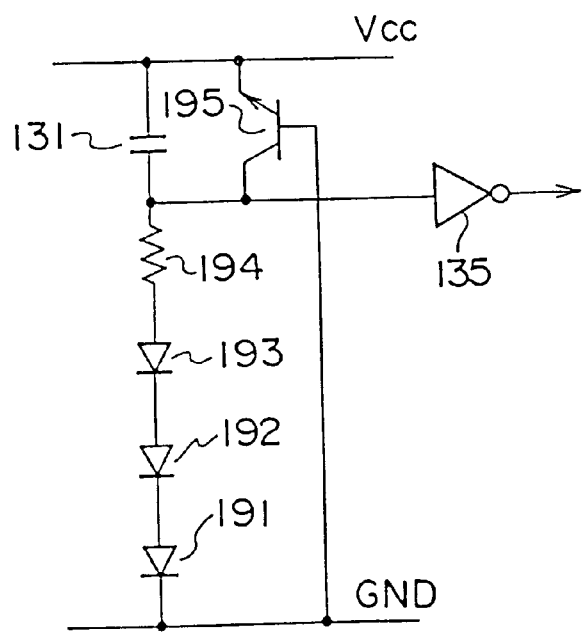
FIG. 15 is a circuit diagram of a power on reset circuit in accordance with the eighth embodiment of this invention.

Referring to FIG. 15, the n channel normally off FET (123) illustrated in FIG. 10 is replaced by a series circuit of a diode (193) and a resistor (194), the n channel normally off FET (122) illustrated in FIG. 10 is replaced by a diode (192), the n channel normally off FET (121) illustrated in FIG. 10 is replaced by a diode (191), and the n channel normally off FET (132) illustrated in FIG. 10 is replaced by a bipolar transistor (195).

The foregoing description has clarified that a plurality of power on reset circuits which can issue a one shot pulse without fail, even if the increase rate of the power supply voltage is less, wherein the circuit structure is simple and the power consumption is marginal for a period after the one shot pulse is once issued just after a power supply is turned on for the circuit in addition to some other advantages has been successfully provided by this invention.

Although this invention has been described with reference to specific embodiments, this description is not meant to be construed in a limiting sense. Various modifications of the disclosed embodiments as well as other embodiments of this invention, will be apparent to persons skilled in the art upon reference to the description of this invention. It is therefore contemplated that the appended claims will cover any such modifications or embodiments as fall with the true scope of this invention.

What is claimed is:

1. A power on reset circuit comprising:
    a power supply voltage sensing circuit further comprising,
        a voltage sensing means connected between a power supply and the ground, and turning on in response to an excess of a voltage of said power supply with respect to a first threshold value, to work as an electric current flowing path and depicting a sensed voltage at a first node, and
        an electric current path disconnecting means working as an ON/OFF element depending on a feed back voltage, disconnecting an electric current path in response to an OFF position thereof, whereby said power supply voltage sensing circuit senses an ON position of said power supply depending on the ON position of said electric current path disconnecting means;
    a capacitor charging circuit further comprising,
    an electric current flowing path means connected between said power supply and a second node and turning on in response to said sensed voltage,
        a capacitor connected between said second node and the ground and being charged by said electric current flowing path means with a charging rate determined by a time constant,and
        a discharging means turning on in response to a deficiency of said voltage of said power supply with respect to a second threshold value, for discharging said capacitor; and
    an output circuit means driven with said power supply, comparing the voltage of said second node and a third threshold value and outputting a logic level corresponding to a result of said comparison, wherein said feed back voltage is the voltage of said second node.

2. A power on reset circuit in accordance with claim 1, wherein:
    said electric current path disconnecting means is a first FET comprising a first electric current flowing electrode connected with said power supply, a second electric current flowing electrode connected with said first node, and a first control electrode being input with said feed back voltage for regulating the ON/OFF position between said first electric current flowing electrode and said second electric current flowing electrode,
    said voltage sensing means is a plurality of rectifier means connected between said first node and the ground and turning on in response to an excess of the sensed voltage of said first node with respect to a fourth threshold value,
    said electric current flowing path means is a second FET comprising a third electric current flowing electrode connected with said power supply, a fourth electric current flowing electrode connected with said second node, and a second control electrode connected with said first node and conducting an ON/OFF control of the electric current path connecting said third electric current flowing electrode and said fourth electric current flowing electrode in response to said fourth electric current flowing electrode in response to said sensed voltage,
    said discharging means further comprising a fifth electric current flowing electrode connected with said second node, a sixth electric current flowing electrode connected with the ground, and a third control electrode connected with said power supply and conducting the ON/OFF control of said electric current path connecting said fifth electric current flowing electrode and said sixth electric current flowing electrode, and a third FET turning on in response to a deficiency of said voltage of said power supply with respect to a fifth threshold value.

3. A power on reset circuit in accordance with claim 2, further comprising a rectifier means or a resistor connected in series with said second FET and for increasing the ON resistance of said second FET in response to an ON position thereof, said rectifier means or said resistor being connected between said power supply and said second node.

4. A power on reset circuit comprising:
    a first transistor having a first electrode, a second electrode and a control electrode, the first electrode of said first transistor being connected to a first voltage supplied node, the second electrode of said first transistor being connected to a first node, the control electrode of said first transistor being connected to a second node;
    a second transistor having a first electrode, a second electrode and a control electrode, the first electrode of said second transistor being coupled to said first voltage supplied node, the second electrode of said second transistor being connected to said second node, the control electrode of said second transistor being connected to said first node;
    a capacitor connected between said second node and a second voltage supplied node;
    a third transistor having a first electrode, a second electrode and a control electrode, the first electrode of said third transistor being connected to said second node, the second electrode of said third transistor being connected to said second voltage supplied node, the control electrode of said third transistor being connected to said first voltage supplied node;
    a rectifier circuit connected between said first node and said second voltage supplied node.

5. A power on reset circuit in accordance with claim 4, wherein said first, said second and said third transistor are MOS transistors of a same conductive type respectively.

6. A power on reset circuit in accordance with claim 4, wherein said rectifier circuit further comprises a plurality of MOS transistors connected in series between said first node and said second voltage supplied node, each of the MOS transistors having a first electrode, a second electrode and a control electrode, the second electrode of each said MOS transistor being connected to the control electrode of said MOS transistor.

7. A power on reset circuit in accordance with claim 4, further comprising a fourth transistor having a first electrode, a second electrode, and a control electrode, the first electrode of said fourth transistor connected to said first voltage supplied node the second electrode of said fourth transistor being connected to the first electrode of said second transistor, and the control electrode of said fourth transistor being connected to said second electrode of said fourth transistor.

8. A power on rest circuit in a accordance with claim 5, further comprising a fourth transistor having a first electrode, a second electrode, and a control electrode, the first electrode of the said fourth transistor being connected to said first voltage supplied node, the second electrode of said fourth transistor being connected to said first electrode of said second transistor, the control electrode of said fourth transistor being connected to the second electrode of the said fourth transistor, wherein the fourth transistor is a MOS transistor of same conductive type as said first, second, and third transistors.

9. A power on reset circuit in accordance with claim 4, further comprising an output circuit connected to said second node, said output circuit outputting an output signal having a same logic level as a voltage of said second node.

10. A power on reset circuit, comprising:

a rectifier circuit connected between a voltage supplied node and an output node;

a capacitor connected between a second voltage supplied node and said output node; and a first transistor having a first electrode, a second electrode, and a control electrode, the first electrode of said first transistor being connected to said output node, the second electrode of said first transistor being connected to said second voltage supplied node, and the control electrode of said first transistor being connected to said first voltage supplied node.

11. A power on reset circuit in accordance with claim 10, wherein said rectifier circuit further comprises:

a plurality of second transistors connected in series, each of the second transistors having a first electrode, a second electrode, and a control electrode, the second electrode of each said second transistor being connected to the control electrode of said second transistor; and a third transistor having a first electrode, a second electrode, and a control electrode, the first electrode of said third transistor being connected to the first electrode of one of said second transistors, the second electrode of said third transistor being connected to said output node, and the control electrode of said third transistor being connected to said second voltage supplied node.

12. A power on reset circuit in accordance with claim 10, wherein said first transistor, said second transistors, and said third transistor are MOS transistors of a same conductive type respectively.

13. A power on reset circuit in accordance with claim 10, wherein said rectifier circuit further comprises:

a plurality of diodes connected in series; and a resistance element connected between one of said diodes and said output node.

14. A power on reset circuit in accordance with claim 13, wherein said first transistor is a bipolar transistor.

15. A power on reset circuit in accordance with claim 10, further comprising an output circuit connected to said output node, said output circuit outputting a signal having a same logic level as a voltage of said output node.

* * * * *

UNITED STATES PATENT AND TRADEMARK OFFICE
CERTIFICATE OF CORRECTION

PATENT NO. : 5,930,129
DATED : July 27, 1999
INVENTOR(S) : Naoaki Sugimura

It is certified that error appears in the above-indentified patent and that said Letters Patent is hereby corrected as shown below:

Column 15, lines 16 and 17, change "power supply" to --first node--.

Column 15, line 18, change "said" to --a--.

Column 15, line 20, change "a" to --said--. (second occurrence).

Signed and Sealed this

Second Day of November, 1999

Q. TODD DICKINSON

Attest:

Attesting Officer

Acting Commissioner of Patents and Trademarks